United States Patent
Fiedler et al.

(10) Patent No.: US 12,224,175 B2
(45) Date of Patent: Feb. 11, 2025

(54) APPARATUS AND METHOD OF FORMING A SEMICONDUCTOR LAYER

(71) Applicant: Infineon Technologies AG, Neubiberg (DE)

(72) Inventors: Olaf Fiedler, Dresden (DE); Daniel Kai Simon, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 503 days.

(21) Appl. No.: 17/509,256

(22) Filed: Oct. 25, 2021

(65) Prior Publication Data

US 2022/0051891 A1 Feb. 17, 2022

Related U.S. Application Data

(62) Division of application No. 16/272,134, filed on Feb. 11, 2019, now abandoned.

(30) Foreign Application Priority Data

Feb. 13, 2018 (DE) .......................... 102018103168.8

(51) Int. Cl.
*H01L 21/02* (2006.01)
*C23C 16/24* (2006.01)
(Continued)

(52) U.S. Cl.
CPC ........ *H01L 21/02532* (2013.01); *C23C 16/24* (2013.01); *C23C 16/4481* (2013.01);
(Continued)

(58) Field of Classification Search
CPC ........... H01L 21/02532; H01L 21/0262; H01L 21/68714; H01L 21/02205–02222; H01L 21/28556–28562; C23C 16/24; C23C 16/4481; C23C 16/52; C23C 16/4482; C23C 16/45502; C23C 16/54–545; C23C 16/5096; C30B 25/14; C30B 25/165; C30B 29/06
See application file for complete search history.

(56) References Cited

U.S. PATENT DOCUMENTS

2004/0083962 A1* 5/2004 Bang .................. C23C 16/4481 118/715
2010/0275844 A1* 11/2010 Kim .................... C23C 16/4485 118/715
(Continued)

FOREIGN PATENT DOCUMENTS

JP 2004363271 A 12/2004

*Primary Examiner* — Shahed Ahmed
(74) *Attorney, Agent, or Firm* — Murphy, Bilak & Homiller, PLLC

(57) ABSTRACT

A method of forming a silicon layer includes introducing a source gas containing a precursor material and a carrier gas into a reactor, controlling a gas flow of the source gas through a first main flow controller unit in response to a change of a concentration of the precursor material in the source gas, introducing an auxiliary gas into the reactor, and controlling a gas flow of the auxiliary gas through a second main flow controller unit such that a total gas flow of the source gas and the auxiliary gas into the reactor is held constant when the gas flow of the source gas changes.

11 Claims, 7 Drawing Sheets

(51) Int. Cl.
   *C23C 16/448*     (2006.01)
   *C23C 16/52*      (2006.01)
   *H01L 21/687*     (2006.01)

(52) U.S. Cl.
   CPC .......... *C23C 16/52* (2013.01); *H01L 21/0262* (2013.01); *H01L 21/68714* (2013.01)

(56) References Cited

U.S. PATENT DOCUMENTS

2016/0056035 A1   2/2016   Toyoda et al.
2017/0101715 A1   4/2017   Nishizato et al.

\* cited by examiner

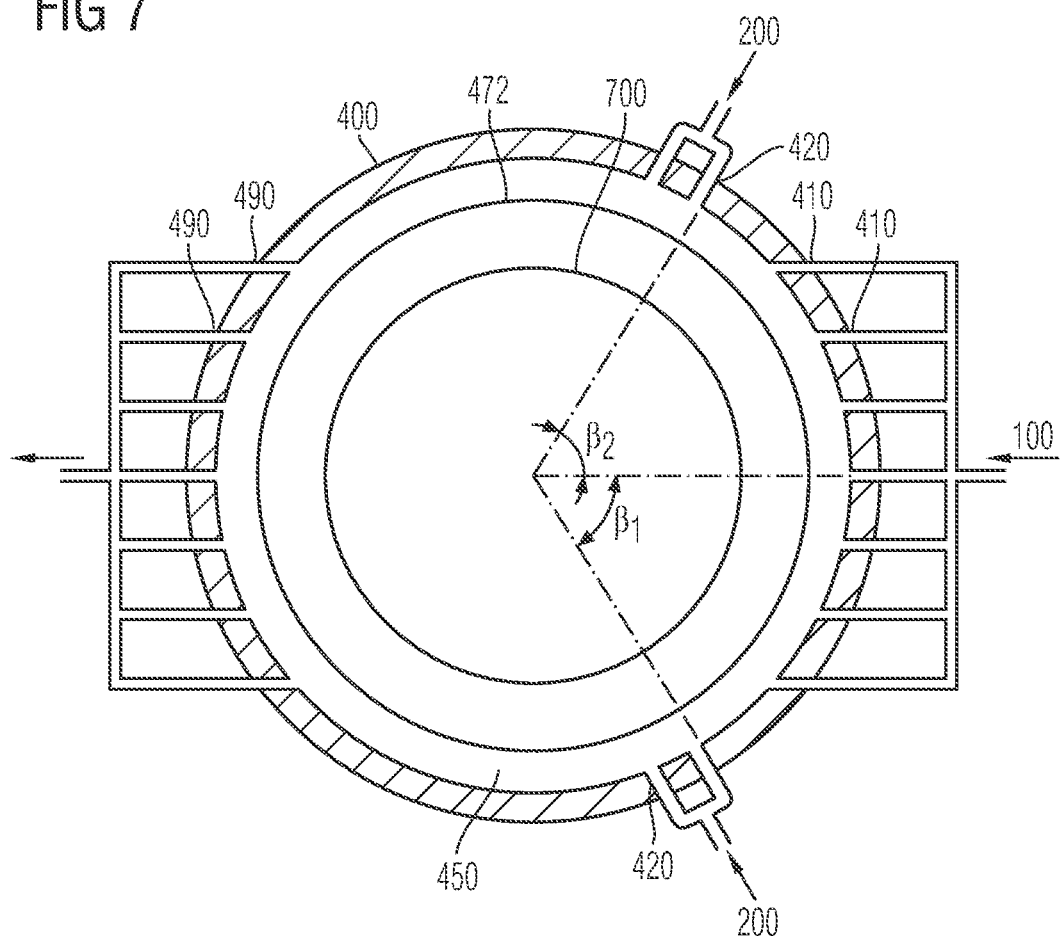

APPARATUS AND METHOD OF FORMING A SEMICONDUCTOR LAYER

RELATED APPLICATIONS

The present application is a divisional of and claims priority to U.S. application Ser. No. 16/272,134 filed on Feb. 11, 2019, the content of which is incorporated by reference herein in its entirety.

TECHNICAL FIELD

The present disclosure relates to an apparatus for forming a semiconductor layer and to a method of forming a semiconductor layer.

BACKGROUND

Semiconductor layers may be deposited as amorphous or polycrystalline layers or may be grown by epitaxial deposition as single crystal layers on an appropriate crystalline basis. For deposition of a silicon layer, a semiconductor wafer is placed on a wafer holder (susceptor) in a deposition chamber. A front surface of the semiconductor wafer may be subjected to a cleaning gas. Then the semiconductor wafer is subjected to a vaporous silicon source such as a silane at an appropriate temperature and at an appropriate pressure to deposit and/or grow a semiconductor layer on the front surface. During deposition of the semiconductor layer the susceptor may rotate to improve the uniformity of the deposition across the front surface of the semiconductor wafer. There is a need to further improve the deposition of semiconductor layers.

SUMMARY

The present disclosure refers to a method of forming a semiconductor layer. A source gas that contains a precursor material and a carrier gas is introduced into a reactor, wherein a gas flow of the source gas is controlled in response to a change of a concentration of the precursor material in the source gas. An auxiliary gas is introduced into the reactor, wherein a gas flow of the auxiliary gas is controlled such that a total gas flow of the source gas and the auxiliary gas into the reactor is held constant when the gas flow of the source gas changes.

The present disclosure further refers to an apparatus for forming a semiconductor layer. The apparatus includes a reactor which is adapted for vapor phase deposition of a semiconductor layer. A first main flow controller unit is configured to control a gas flow of a source gas into the reactor, wherein the source gas contains a precursor material and a carrier gas. A second main flow controller unit is configured to control a gas flow of an auxiliary gas into the reactor. A processor unit is configured to control the second main flow controller unit in response to information about a change of the gas flow of the source gas through the first main flow controller unit.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate the embodiments of the present disclosure and together with the description serve to explain principles of the embodiments. Other embodiments and intended advantages will be readily appreciated as they become better understood by reference to the following detailed description.

FIG. 7 is a schematic horizontal cross-sectional view of a vapor phase deposition reactor with groups of cross-flow inlets according to a further embodiment.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The term "gas flow" as used in the following stands for a mass flow of a gaseous substance.

Figure 1:
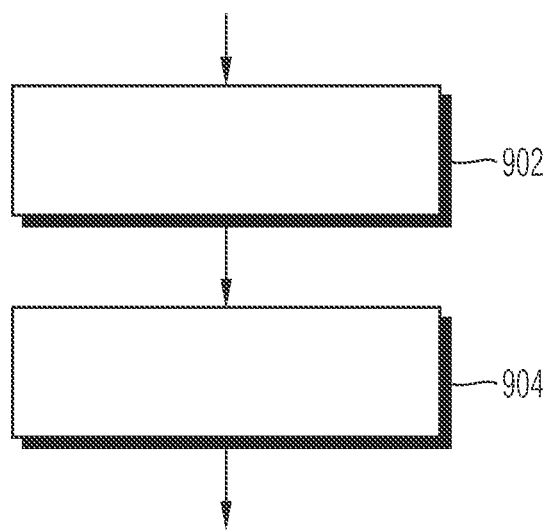
FIG. 1 is a schematic flowchart of a method of forming a semiconductor layer according to an embodiment.

FIG. 1 refers to an embodiment of a method for forming a semiconductor layer. A source gas, which contains a precursor material and a carrier gas, is introduced into a reactor, wherein a gas flow of the source gas is controlled in response to a change of a concentration of the precursor material in the source gas (902). An auxiliary gas is introduced into the reactor, wherein a gas flow of the auxiliary gas is controlled such that a total gas flow of the source gas and the auxiliary gas into the reactor is held constant when the gas flow of the source gas changes (904).

In the reactor a constituent of the precursor material deposits on a front surface of a substrate and forms a semiconductor layer.

The substrate may be a semiconductor wafer, e.g., a silicon wafer, a germanium wafer, a wafer from a germanium-silicon crystal or an SOI (silicon-on-insulator) wafer with a single-crystal base layer formed on an insulating substrate such as glass. The semiconductor wafer or the single-crystalline base layer may be intrinsic or may include dopant atoms. The semiconductor wafer or the single-crystalline base layer may include non-doping atoms as process-induced impurities.

The semiconductor layer may be amorphous, nanocrystalline, microcrystalline or polycrystalline. According to an embodiment, the semiconductor layer is a single-crystal silicon layer grown by epitaxy on a suitable crystalline base, wherein atoms of the deposited constituent of the precursor material lock into the crystallographic orientation of the crystalline base and the deposited layer grows in registry with a crystal lattice of the crystalline base. For example, silicon atoms may be deposited on a silicon crystal, a germanium crystal, or a germanium/silicon crystal and may form a semiconductor layer from silicon. The semiconductor layer may be intrinsic or may include dopant atoms. The semiconductor layer may include non-doping impurities as a result of process imperfections.

The precursor material contains the constituent of the deposited layer, for example, silicon. The carrier gas and the auxiliary gas may be free of constituents of the deposited semiconductor layer. The carrier gas and the auxiliary gas may have different compositions or the same composition.

The reactor may include a chamber adapted for vapor phase deposition, e.g., vapor phase epitaxy.

In the source gas, the mass ratio between precursor material and carrier gas may change with time. A gas flow of the source gas into the reactor may be controlled in response to a change of a concentration of the precursor material in the source gas such that the amount of precursor material introduced into the reactor per time unit is held constant when the concentration of the precursor material in the source gas changes. For example, if an initial concentration of the preliminary material in the source gas rises from 10% to 11%, the source gas flow of the source gas into the reactor may be reduced by about 10% to keep the amount of precursor material introduced into the reactor per time unit constant.

In addition to and contemporaneously with the source gas an auxiliary gas is introduced into the reactor, wherein an auxiliary gas flow of the auxiliary gas into the reactor is controlled such that a total gas flow made up of the source gas flow and the auxiliary gas flow into the reactor is held constant when the source gas flow changes.

It could be shown by the Inventors that when the total gas flow into the reactor decreases, the uniformity of the deposited semiconductor layer across the front surface of the semiconductor wafer may decrease. In particular, in the center of the front surface the semiconductor layer may grow at a lower rate than along the edge of the front surface. Compensating the reduction of the source gas flow by an increase of the auxiliary gas flow and keeping the total gas flow into the reactor constant may result in that the semiconductor layer grows at higher uniformity across the front surface of the semiconductor wafer.

According to an embodiment, the source gas may be combined with the auxiliary gas prior to introduction into the reactor, wherein the source gas and the auxiliary gas form a main gas mixture that is introduced into the reactor through at least one main inlet, wherein a more uniform distribution of the precursor material in the reactor may be achieved.

The source gas may be combined with the auxiliary gas to form, in addition to a main gas mixture, a cross-flow gas mixture. The cross-flow gas mixture may be introduced into the reactor through at least one cross-flow inlet. A flow direction of the cross-flow gas mixture at an opening of the cross-flow inlet into the reactor may be tilted to a flow direction of the main gas mixture at an opening of the main inlet into the reactor. For example, an angle between the flow direction of the cross-flow gas mixture at the opening of the cross-flow inlet and the flow direction of the main gas mixture at the opening of the main inlet may be in a range from 45° to 135°, for example in a range from 85° to 95°. The main inlets and the cross-flow inlets may be arranged to be oriented to a horizontal center point of the front surface of the semiconductor wafer.

According to an embodiment the ratio of a gas flow of the main gas mixture to a gas flow of the cross-flow gas mixture is kept constant, when the source gas flow changes.

Typically, a mass ratio between the main flow through the main inlets and the cross-flow through the cross-flow inlets is unequal 1, for example, greater than 1. When the concentration of the precursor material in the source gas rises, the source gas flow is reduced in both the main flow and the cross-flow at an equivalent amount, wherein the mass ratio between main flow and cross-flow changes. It could be shown by the Inventors that the change of the mass ratio between the main flow to the cross-flow may adversely affect the uniformity of the deposited semiconductor layer.

According to an embodiment, the portion of the auxiliary gas in the cross-flow gas mixture may be controlled such that the mass ratio of the main flow to the cross-flow is held constant such that semiconductor layers, e.g. epitaxial silicon layers can deposit with high thickness uniformity across the complete wafer surface.

The precursor material may contain a semiconductor element, for example, silicon and/or germanium.

According to an embodiment the precursor material may be liquid at a temperature of 30° Celsius. The carrier gas may pass through the liquid precursor material and may vaporize a portion of the liquid precursor material to form the source gas. The efficiency at which the carrier gas vaporizes the liquid precursor material may change with time and holding the gas flows constant may compensate for the fluctuations of the vaporizing process. For example, the precursor material contains at least one of TCS (trichlorosilane, $HSiCl_3$) and tetrachlorosilane $SiCl_4$.

The carrier gas may contain hydrogen gas. For example, the carrier gas may contain hydrogen gas as sole main constituent and includes other components only as unwanted impurities. According to other embodiments, the carrier gas may contain at least one noble gas, such as helium, argon and neon.

The auxiliary gas may contain hydrogen gas. For example, the auxiliary gas may contain hydrogen gas as sole main constituent and may contain other components only as unwanted impurities. According to other embodiments, the auxiliary gas may contain at least one noble gas, such as helium, argon and neon. The auxiliary gas and the carrier gas may include the same main constituents at the same ratio or at different ratios.

Figure 2A:
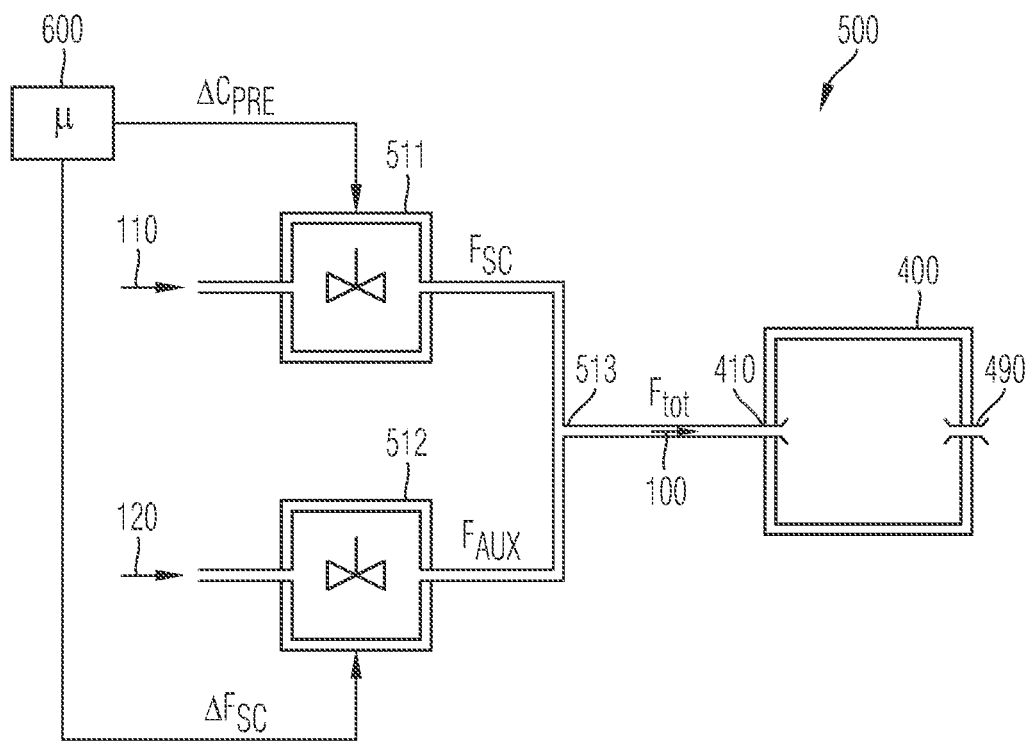
FIG. 2A is a schematic block diagram of an apparatus including a processor unit controlling a first main flow controller unit and a second main flow controller unit according to an embodiment.

FIG. 2A shows an apparatus 500 for forming semiconductor layers. The apparatus 500 includes a reactor 400 that is adapted for the deposition of a semiconductor layer by vapor phase deposition, for example, by vapor phase epitaxy. A first main flow controller unit 511 controls a gas flow of a source gas 110 into the reactor 400, wherein the source gas 110 contains a precursor material and a carrier gas. A second main flow controller unit 512 controls a gas flow of an auxiliary gas 120 into the reactor 400.

The first and second main flow controller units 511, 512 may include MFCs (mass flow controllers) that control the rate of flow of a gaseous compound or gaseous mixture that passes the MFC according to a selected setpoint. For example, the MFC may include a mass flow sensor, a control valve and an internal control unit that may compare a value of the gas flow obtained from the mass flow sensor to adjust the control valve in an appropriate way to achieve a flow rate according to the selected setpoint.

A main mixture unit 513 may combine the source gas 110 and the auxiliary gas 120 after the passage through the first and second main flow controller units 511, 512 and prior to entering the reactor 400. The main mixture unit 513 delivers a main gas mixture 100 that contains the source gas 110 and the auxiliary gas 120 and that enters the reactor 400 through at least one main inlet 410.

A processor unit 600 may control the first main flow controller unit 511 in response to information about a change $\Delta C_{pre}$ of a concentration $C_{pre}$ of the precursor material in the source gas 110. For example, the processor unit 600 may control the first main flow controller unit 511 to keep a rate at which the precursor material enters the reactor 400 constant. The processor unit 600 may control the first main flow controller unit 511 to reduce the source gas flow $F_{SC}$ when the concentration $C_{pre}$ of the precursor material in the source gas 110 rises.

The processor unit 600 controls the second main flow controller unit 512 in response to information about the change $\Delta F_{SC}$ of the source gas flow $F_{SC}$ through the first main flow controller unit 511. For example, the processor unit 600 may control the second main flow controller unit 512 to keep a total gas flow $F_{tot}$ of the source gas 110 and the auxiliary gas 120, e.g., of the main gas mixture 100 into the reactor 400 constant. The processor unit 600 may control the second main flow controller unit 512 to let more of the auxiliary gas 120 pass when the first main flow controller unit 511 reduces the source gas flow $F_{SC}$. As a result, the deposition rate of a semiconductor layer formed on a front surface of a semiconductor wafer placed in the reactor 400 shows high uniformity across the complete front surface.

The apparatus 500 may further include a concentration measurement unit that measures a concentration of the precursor material in the source gas 110. The concentration measurement unit may be data connected with the processor unit 600 such that the processor unit 600 can control the first and second main flow controller units 511, 512 in response to information about the change $\Delta C_{pre}$ of a concentration $C_{pre}$ of the precursor material in the source gas 110.

Figure 2B:
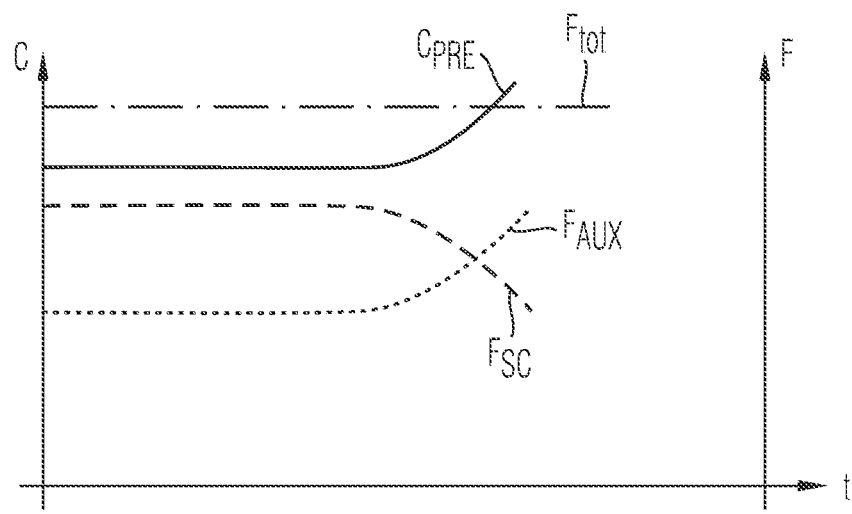
FIG. 2B is a schematic diagram illustrating the control of gas flows with time for discussing effects of the embodiments.

FIG. 2B shows an example of the control of the processor unit 600 exerted on the second main flow controller unit 512. In the source gas 110 a concentration $C_{p}re$ of the precursor material may rise to a certain degree after a certain process time. In response to information indicating the rise $\Delta C_{pre}$ of $C_{pre}$ the processor unit 600 may control the first main flow controller unit 511 to reduce the source gas flow $F_{SC}$ into the reactor 400 such that the rate at which precursor material is introduced into the reactor 400 remains constant. In addition, in response to information indicating the change $\Delta F_{SC}$ of the flow of the source gas 110, the processor unit 600 controls the second main flow controller unit 512 to increase the auxiliary gas flow $F_{aux}$ such that a total gas flow $F_{tot}$ of the source gas 110 and the auxiliary gas 120 into the reactor 400 remains constant. The constant total gas flow $F_{tot}$ in combination with the constant rate at which the precursor material is introduced into the reactor 400 provides highly uniform deposition rates across a wafer surface. For many applications the uniformity of the deposition outweighs some thickness variation as a result of a slight change of the deposition rate with time.

Figure 3:
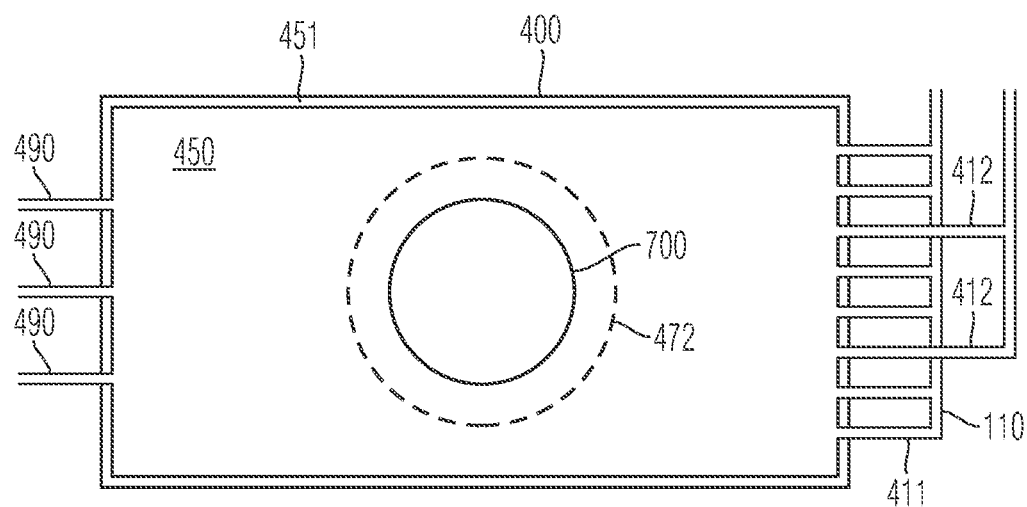
FIG. 3 is a schematic diagram of a reactor for vapor phase deposition according to an embodiment.

FIG. 3 shows a reactor 400 suitable for chemical vapor deposition, e.g., chemical vapor epitaxy. A wafer holder 472 (susceptor, wafer support) in a chamber 450 of the reactor 400 is adapted for carrying a semiconductor wafer 700 with a thickness of less than 1 mm and with a diameter of 100 mm, 150 mm, 200 mm, 300 mm, or 450 mm by way of example. In a horizontal plane defined by the supporting surface of the wafer holder 472, the chamber 450 may have an approximately rectangular cross-section. The reactor 400 may include heating members that may heat at least one of the wafer holder 472, a chamber wall 451 and a semiconductor wafer 700 placed on the wafer holder 472. The reactor 400 may also include a motor drive unit for rotating the susceptor around a vertical axis through the horizontal center point during deposition. According to an embodiment the reactor 400 includes a radiation source for applying heat, e.g. a temperature of at least 800° C. or at least 900° C. to an exposed front surface of the semiconductor wafer 700.

The reactor 400 may include several first main inlets 411 through which a source gas 110 or a mixture of the source gas 110 and an auxiliary gas 120 is introduced into the chamber 450 and may include second main inlets 412 for introducing the auxiliary gas 120 without source gas into the reactor chamber 450. The first and the second main inlets 411, 412 may be arranged at one side of the chamber 450. The chamber wall 451 may include at least one outlet 490, which may be arranged at a side opposite to the first and second main inlets 411, 412.

With the reactor 400 of FIG. 3 used in the apparatus 500 as illustrated in FIG. 2A, the processor unit 600 may control the first and second main flow controller units 511, 512 such the total amount of auxiliary gas 120 and source gas 110 introduced through the first and second main inlets 411, 412 is held constant when the source gas flow changes.

Figure 4A:
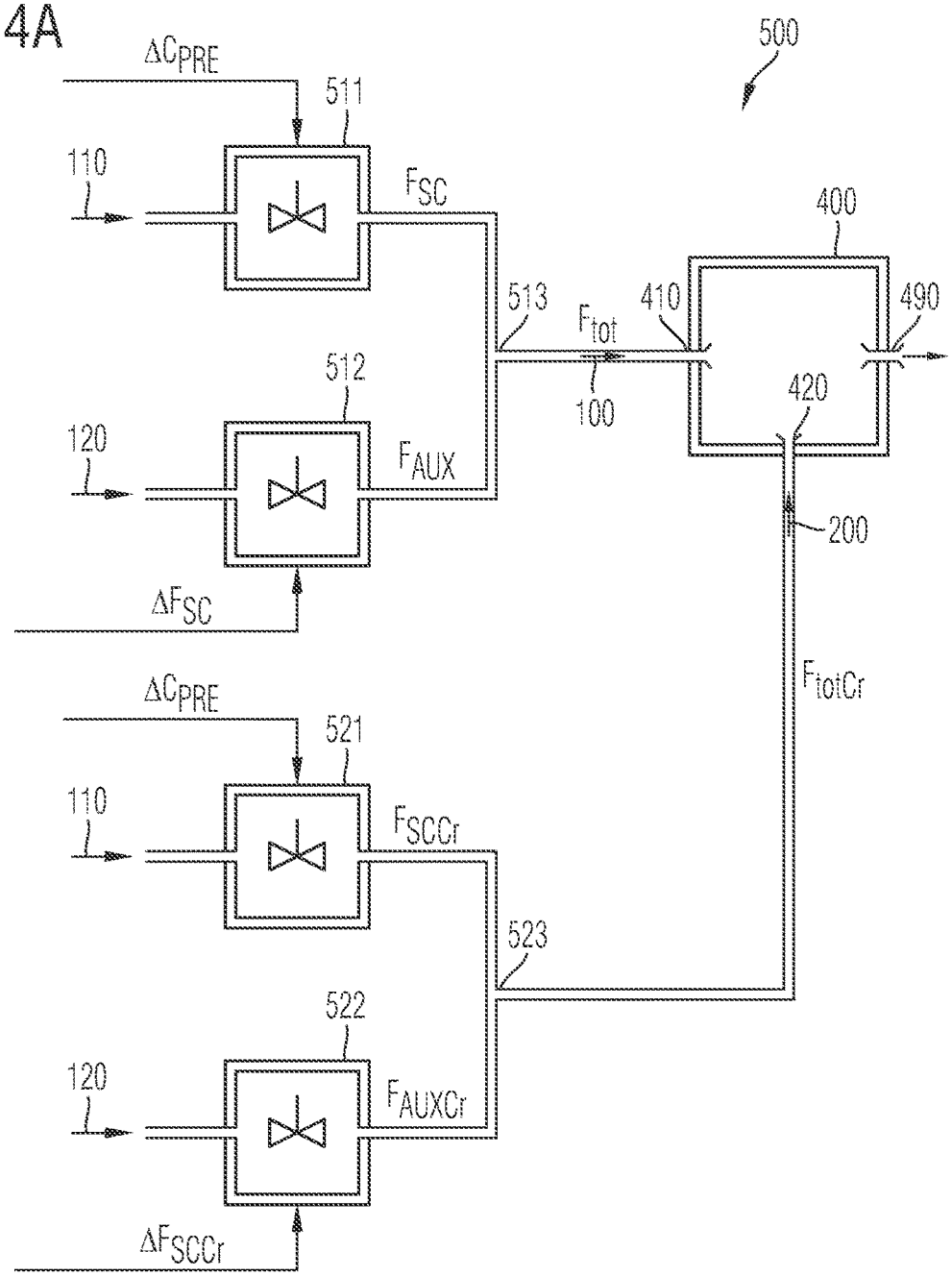
FIG. 4A is a schematic block diagram of an apparatus for forming semiconductor layers according to an embodiment concerning the control of main flow and cross-flow.
Figure 4B:
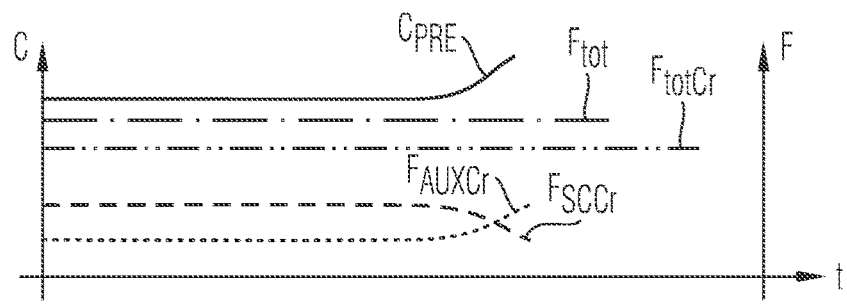
FIG. 4B is a schematic diagram illustrating the control of gas flows for discussing effects of the embodiments.

FIGS. 4A and 4B refer to an apparatus 500 that includes a reactor 400 with at least one cross-flow inlet 420 for letting pass a cross-flow gas mixture 200, wherein a flow direction of the cross-flow gas mixture 200 at an opening of the cross-flow inlet 420 into the reactor 400 is tilted to a flow direction of the main gas mixture 100 at an opening of the main inlet into the reactor 400. A tilt angle between the two flow directions may be in a range from, e.g., 45° to 135°, e.g., 85° to 95°.

In addition to a first and a second main flow controller unit 511, 512 as described with reference to FIGS. 2A and 2B, the apparatus 500 includes a first cross-flow controller unit 521 that controls a gas flow $F_{SCCr}$ of the source gas through the at least one cross-flow inlet 420. A second cross-flow controller unit 522 controls a gas flow $F_{AuxCr}$ of the auxiliary gas 120 through the at least one cross-flow inlet 420. The first and second cross-flow controller units 521, 522 may be or may include MFCs.

The second cross-flow controller unit 522 may be controlled in response to data that contains information about the change $\Delta F_{SCCr}$ of the gas flow $F_{SCCr}$ of the source gas 110 through the first cross-flow controller unit 521. For example, the second cross-flow controller unit 522 is controlled such that a total gas flow $F_{totCr}$ of the auxiliary gas 120 and the source gas 110 through the cross-flow inlet 420 remains constant.

Figure 5:
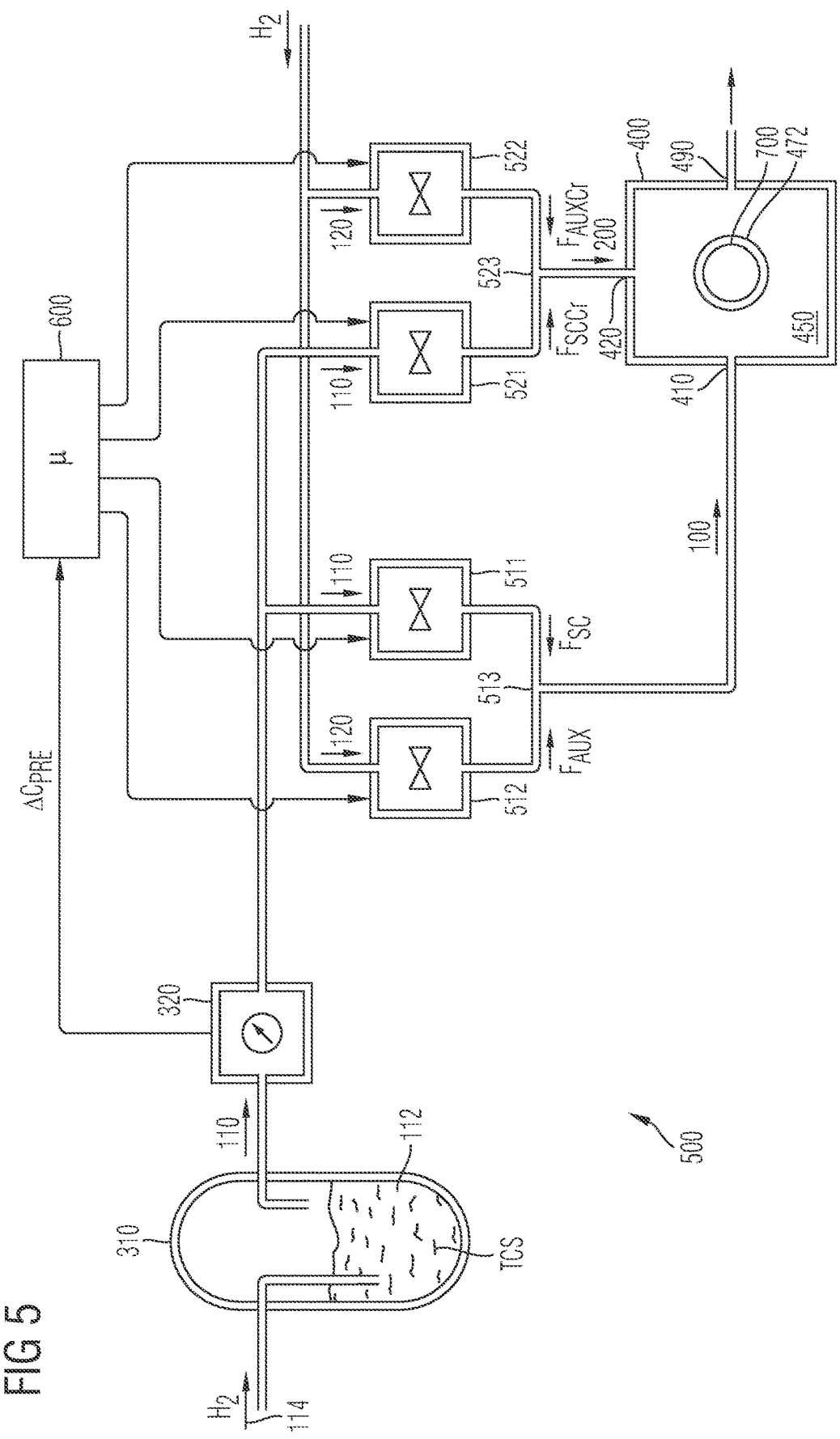
FIG. 5 is a schematic diagram of an apparatus for forming semiconductor layers according to a further embodiment concerning liquid precursor materials.

FIG. 5 shows a further apparatus 500 for forming a semiconductor layer. A bubbler 310 contains a precursor material 112 that is liquid at a temperature of 30° C. The precursor material 112 may be tetrachlorosilane or trichlorosilane or a mixture of both. A carrier gas 114 passes through the liquid precursor material 112 and vaporizes some of the liquid precursor material 112. A mixture of the carrier gas 114 and vaporized components of the precursor material 112 leaves the bubbler 310 through an outlet and forms the source gas 110. The carrier gas 114 may contain hydrogen gas and/or one or more noble gases such as helium, argon and neon. According to an embodiment, the carrier gas 114 contains hydrogen gas as the only main constituent and contains other atoms, molecules and/or compounds only as impurities.

A concentration measurement unit 320 may measure a content of the precursor material 112 in the source gas 110. The concentration measurement unit 320 may be data-linked with a processor unit 600 and may transmit information about a change $\Delta C_{pre}$ of a concentration $C_{pre}$ of the precursor material 112 in the source gas 110 to the processor unit 600.

A first main flow controller unit 511 controls a gas flow $F_{SC}$ of the source gas 110 through one or more main inlets 410 of a reactor 400. A first cross-flow controller unit 521 controls a gas flow $F_{SCCr}$ of the source gas 110 through one or more cross-flow inlets 420 of the reactor 400.

A second main flow controller unit 512 controls a gas flow $F_{Aux}$ of an auxiliary gas 120 into the reactor 400 through the one or more main inlets 410. A second cross-flow controller unit 522 controls the gas flow $F_{AuxCr}$ of the auxiliary gas 120 through the one or more cross-flow inlets 420.

A main mixture unit 513 may combine the source gas 110 passing the first main flow controller unit 511 and the auxiliary gas 120 passing the second main flow controller unit 512 prior to introduction into the reactor 400. A cross-flow mixture unit 523 may combine the source gas 110 passing the first cross-flow controller unit 521 and the auxiliary gas 120 passing the second cross-flow controller unit 522 prior to introduction into the reactor 400.

The processor unit 600 may control the first main flow controller unit 511 in response to a change $\Delta C_{pre}$ of the concentration $C_{pre}$ of the precursor material 112 in the source gas 110 in a way that the rate at which the precursor material 112 is delivered to the reactor 400 through the one or more main inlets 410 is constant even when the concentration $C_{pre}$ changes.

To this purpose, the processor unit 600 may administer setting values of the flow controller units 511, 512, 521, 522. According to an embodiment, the processor unit 600 may request and/or receive the setpoints of the first main flow controller unit 511 and the first cross-flow controller unit 521 for determining the control values for the second main flow controller unit 512 and the second cross-flow controller unit 522.

The processor unit 600 may also control the first cross-flow controller unit 521 in response to the change $\Delta C_{pre}$ of the concentration $C_{pre}$ of the precursor material 112 in the source gas 110 in a way that the rate at which the precursor material 112 is delivered to the reactor 400 through the one or more cross-flow inlets 420 is constant even when the concentration $C_{pre}$ changes.

For example, when the concentration $C_{pre}$ of the precursor material 112 in the source gas 110 rises, the processor unit 600 may control the first main flow controller unit 511 and the first cross-flow controller unit 521 to reduce the source gas flow into the reactor 400 in a way that the amount of the precursor material introduced per time unit into the reactor 400 remains constant.

The processor unit 600 may further control the second main flow controller unit 512 to increase the auxiliary gas flow $F_{AUX}$ such that the total main gas flow $F_{ret}$ through the one or more main inlets 410 remains constant when the first main flow controller unit 511 reduces the source gas flow $F_{SC}$.

In addition, the processor unit 600 may control the second cross-flow controller unit 522 to increase the auxiliary gas flow $F_{AuxCr}$ such that a total cross-flow $F_{totCr}$ through the at least one cross-flow inlet 420 remains constant when the source gas flow $F_{SCCr}$ through the cross-flow inlets changes.

The apparatus 500 facilitates a constant total gas flow into the chamber 450 even when the source gas flow is reduced to compensate for a concentration change of the precursor material 112 in the source gas. The apparatus 500 further facilitates a constant ratio of the main flow to the cross-flow when the concentration of the precursor material 112 in the source gas 110 changes.

The apparatus 500 allows the deposition of epitaxial silicon at a rate of 0-20 μm/min on semiconductor wafers as described above.

Figure 6A:
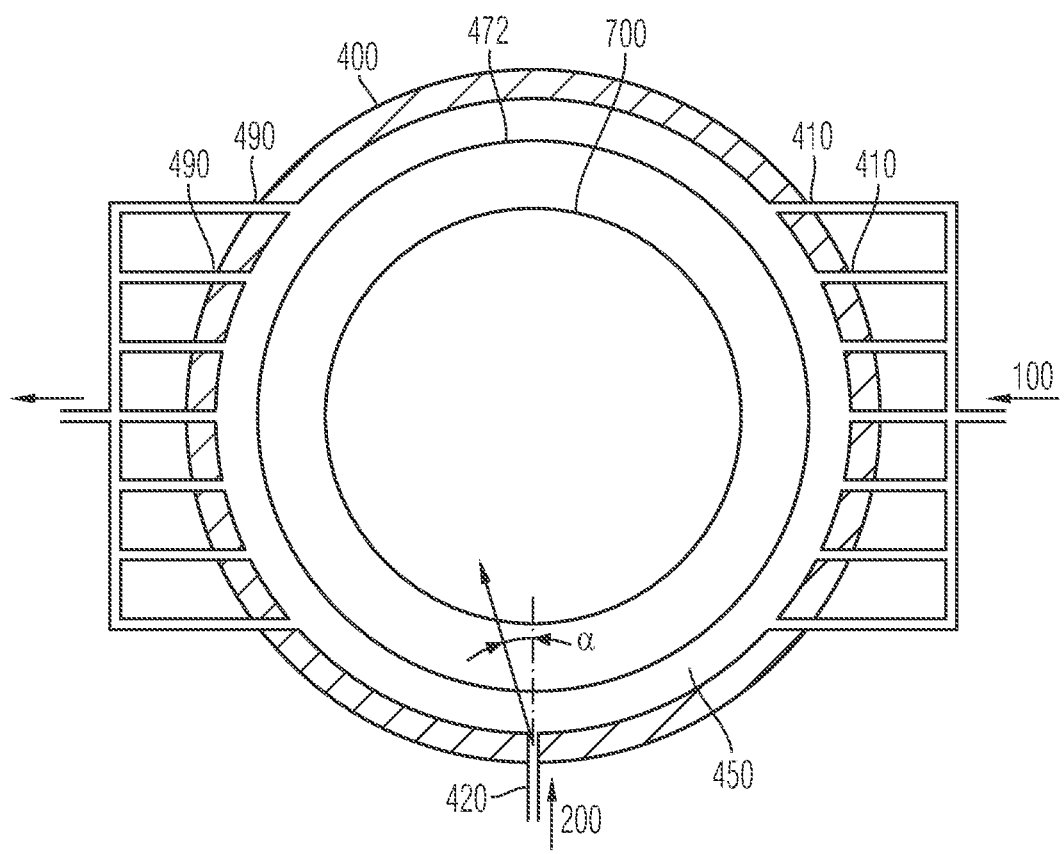
FIG. 6A is a schematic horizontal cross-sectional view of a vapor phase deposition reactor with cross-flow inlets according to a further embodiment.
Figure 6B:
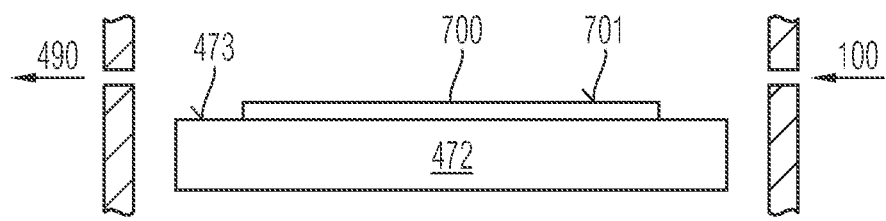
FIG. 6B is a schematic vertical cross-sectional view of the reactor of FIG. 6A.

FIGS. 6A and 6B show a reactor 400 including a chamber 450 with almost circular horizontal cross-section in the plane of a supporting surface 473 of a wafer holder 472. A semiconductor wafer 700 may be placed on the supporting surface 473 of a wafer holder 472 that may be centered to a horizontal center of the chamber 450.

At a first side, the reactor 400 may include one or a plurality of main inlets 410 which may be arranged such that the partial gas flows through the main inlets 410 are parallel to each other. At a second side opposite to the first side, the reactor 400 may include one or more outlets 490. One or more cross-flow inlets 420 are arranged such that gas streams passing the cross-flow inlets 420 have a flow direction tilted to a flow direction of the gas streams through the main inlets 410.

The main flow may be significantly stronger than the cross-flow. The main flow may deflect the cross-flow in the chamber 450 at a certain deflection angle α. Keeping the ratio of the total main flow to the total cross-flow constant results in that the deflection angle α does not change and the deposition rate is more uniform across the wafer surface.

FIG. 7 refers to another embodiment of a reactor 400 with the cross-flow inlets 420 arranged in groups and symmetrically with respect to a symmetry axis of the main inlets 410.

A processor unit as described with reference to FIGS. 2A and 5 may represent an apparatus that controls an epitaxy apparatus for depositing semiconductor layers. The processor unit may be integrated part of the epitaxy apparatus or a stored-program control assigned to and data-linked with the epitaxy apparatus. The processor unit may be a computer, server or part of a network of servers and computers executing a software code.

The apparatus includes means for receiving first data about a concentration of a precursor material in a source gas, wherein the source gas further contains a carrier gas; means for calculating an updated gas flow of the source gas to keep an amount of the precursor material in the source gas constant when the concentration of the precursor material in the source gas changes and means for outputting first control data about the updated gas flow of the source gas; means for calculating an updated gas flow of an auxiliary gas to keep a total gas flow of the source gas and the auxiliary gas constant when the gas flow of the source gas changes; and means for outputting second control data about the auxiliary gas flow.

The apparatus executes a method of controlling the epitaxy apparatus for depositing semiconductor layers. The method includes receiving first data about a concentration of a precursor material in a source gas, wherein the source gas further contains a carrier gas; calculating an updated gas flow of the source gas to keep an amount of the precursor material in the source gas constant when the concentration of the precursor material in the source gas changes and outputting first control data about the updated gas flow of the source gas; calculating an updated gas flow of an auxiliary gas to keep a total gas flow of the source gas and the auxiliary gas constant when the gas flow of the source gas changes and outputting second control data about the auxiliary gas flow.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a silicon layer, the method comprising:
    introducing a source gas containing a precursor material and a carrier gas into a reactor;
    controlling a gas flow of the source gas through a first main flow controller unit in response to a change of a concentration of the precursor material in the source gas;
    introducing an auxiliary gas into the reactor; and
    controlling a gas flow of the auxiliary gas through a second main flow controller unit such that a total gas flow of the source gas and the auxiliary gas into the reactor made up of the source gas flow and the auxiliary gas flow is held constant when the gas flow of the source gas changes.

2. The method of claim 1, wherein the source gas is combined with the auxiliary gas to form a main gas mixture, and wherein the main gas mixture is introduced into the reactor through at least one main inlet.

3. The method of claim 2, wherein the source gas is combined with the auxiliary gas to form a cross-flow gas mixture, wherein the cross-flow gas mixture is introduced into the reactor through at least one cross-flow inlet, and wherein a ratio of a gas flow of the main gas mixture to a gas flow of the cross-flow gas mixture is held constant when the gas flow of the source gas changes.

4. The method of claim 3, wherein a portion of the source gas in the main gas mixture differs from a portion of the source gas in the cross-flow gas mixture.

5. The method of claim 3, wherein a flow direction of the cross-flow gas mixture at an opening of the cross-flow inlet into the reactor is tilted to a flow direction of the main gas mixture at an opening of the main inlet into the reactor.

6. The method of claim 1, wherein the precursor material is liquid at a temperature of 30° C.

7. The method of claim 1, wherein the precursor material contains at least one of trichlorosilane and tetrachlorosilane.

8. The method of claim 1, wherein the carrier gas contains hydrogen gas.

9. The method of claim 1, wherein the auxiliary gas contains hydrogen gas.

10. The method of claim 1, wherein the processor unit responds to the change in concentration of the precursor material in the source gas by controlling the first main flow controller to change the gas flow of the source gas such that the amount of precursor material introduced into the reactor per time unit is held constant while the concentration of the precursor material in the source gas changes, and wherein the processor unit compensates for the change of the gas flow of the source gas by controlling the second main flow controller to change the auxiliary gas flow such that the total gas flow of the source gas and the auxiliary gas into the reactor is held constant when the gas flow of the source gas changes.

11. The method of claim 10, wherein the processor unit responds to an increase in concentration of the precursor material in the source gas by controlling the first main flow controller to decrease the gas flow of the source gas such that the amount of precursor material introduced into the reactor per time unit is held constant while the concentration of the precursor material in the source gas increases, and wherein the processor unit compensates for the decrease of the gas flow of the source gas by controlling the second main flow controller to increase the auxiliary gas flow such that the total gas flow into the reactor is held constant per time unit.

* * * * *